(12) United States Patent  
Glaß et al.

(10) Patent No.: US 12,454,432 B2
(45) Date of Patent: Oct. 28, 2025

(54) UNLOADING DEVICE FOR A SUBSTRATE MAGAZINE, SUBSTRATE MAGAZINE

(71) Applicant: ASYS AUTOMATISIERUNGSSYSTEME GMBH, Dornstadt (DE)

(72) Inventors: Markus Glaß, Achstetten (DE); Matthias Baiker, Vöhringen (DE); Alexander Strehl, Dellmensingen (DE)

(73) Assignee: ASYS AUTOMATISIERUNGSSYSTEME GMBH, Dornstad (DE)

( * ) Notice: Subject to any disclaimer, the term of this patent is extended or adjusted under 35 U.S.C. 154(b) by 216 days.

(21) Appl. No.: 18/500,506

(22) Filed: Nov. 2, 2023

(65) Prior Publication Data

US 2024/0150147 A1 May 9, 2024

(30) Foreign Application Priority Data

Nov. 9, 2022 (DE) ...................... 10 2022 129 638.5

(51) Int. Cl.
*B65H 29/00* (2006.01)
*B65G 65/00* (2006.01)
(Continued)

(52) U.S. Cl.
CPC ............. *B65H 29/003* (2013.01); *B65H 1/30* (2013.01); *B65H 2301/42242* (2013.01); *B65H 2301/44732* (2013.01)

(58) Field of Classification Search
None
See application file for complete search history.

(56) References Cited

U.S. PATENT DOCUMENTS 4,725,182 A 2/1988 Sakamoto et al.
5,397,213 A * 3/1995 Ushiki .............. H01L 21/67721
414/788.7
(Continued)

FOREIGN PATENT DOCUMENTS

DE 196 02 297 A1 7/1997
DE 101 09 199 A1 1/2002
DE 10 2019 217 033 A1 11/2019

*Primary Examiner* — Kavel Singh
(74) *Attorney, Agent, or Firm* — Chrisman Gallo Tochtrop LLC (57) ABSTRACT

The application relates to an unloading device for a substrate magazine, wherein the substrate magazine has multiple drawers in which substrates are arrangeable for storage or temporary storage, having at least one controllable conveyor belt on which substrates can be placed, and having at least one controllable gripper arm, which is designed to push at least one substrate out of a drawer of the substrate magazine to the conveyor belt, wherein the conveyor belt and the gripper arm are arranged on a common and movably mounted carrier, wherein the gripper arm is arranged at least in a starting position below the conveyor belt in order to grip at least one substrate from below for pushing out. It is provided for this purpose that the gripper arm is designed to push a substrate stack having several substrates lying one on top of another out of one of the drawers above the conveyor belt, that a separating device is arranged above the conveyor belt, into which the substrate stack is insertable by the gripper arm and that the separating device is designed to release the lowest substrate of the substrate stack from the substrate stack and deposit it on the conveyor belt underneath.

14 Claims, 5 Drawing Sheets

(51) Int. Cl.
*B65G 65/02* (2006.01)
*B65H 1/30* (2006.01)

(56) References Cited

U.S. PATENT DOCUMENTS

| | | | |
|---|---|---|---|
| 5,562,382 A * | 10/1996 | Miyoshi | H01L 24/78 |
| | | | 414/222.02 |
| 6,045,318 A * | 4/2000 | Mochida | H01L 21/67778 |
| | | | 414/416.03 |
| 9,221,607 B2 * | 12/2015 | Marti | B29D 30/0016 |
| 9,474,194 B2 * | 10/2016 | Kawase | H05K 13/085 |
| 2001/0049875 A1 | 12/2001 | Watanabe et al. | |
| 2004/0168311 A1 | 9/2004 | Watanabe et al. | |
| 2005/0089388 A1 | 4/2005 | Park | |

\* cited by examiner

Fig. 7

# UNLOADING DEVICE FOR A SUBSTRATE MAGAZINE, SUBSTRATE MAGAZINE

CROSS REFERENCE TO RELATED APPLICATION

This application claims the benefit of German Application No. 10 2022 129 638.5, filed on Nov. 9, 2022, the entire disclosure of which is hereby incorporated herein by reference.

FIELD OF THE INVENTION

The invention relates to an unloading device for a substrate magazine, wherein the substrate magazine has multiple drawers in which substrates can be arranged for storage or temporary storage, having at least one controllable conveyor belt on which the substrates can be deposited, having at least one controllable gripper arm which is designed to push at least one substrate out of a drawer of the substrate magazine onto the conveyor belt, wherein the conveyor belt and the gripper arm are arranged on a common and movably mounted carrier, wherein the gripper arm is arranged at least in a starting position below the conveyor belt in order to grip at least one substrate from below.

Furthermore, the invention relates to a substrate magazine system for an assembly line of flat substrates, having at least one substrate magazine which has multiple drawers in which substrates can be arranged for storage or temporary storage.

BACKGROUND OF THE INVENTION

Unloading devices of the type mentioned at the beginning are known from the prior art. For example, a generic unloading device is described in the published patent application DE 10 2019 217 033 A1. This has a gripper arm mounted on a carrier, which can be moved into the substrate magazine in order to pull a substrate out of a drawer of the magazine. For this purpose, the gripper arm has a pivotable gripper finger at its free end that is to be inserted into the magazine first, which is aligned horizontally when inserted, so that it can be inserted between substrates or drawers arranged one above another, and is pivoted about a vertical position or orientation in the inserted state to pull or push a substrate out of the drawer when the gripper arm is withdrawn, so that the substrate is pushed onto the conveyor belt by the gripper arm.

If the substrate magazine is designed in such a way that a substrate stack having multiple substrates lying directly one on top of another can be arranged in a drawer, the gripper arm cannot be inserted between two substrates lying one on top of another, and the stack can only ever be pulled out of the substrate magazine as a whole by the gripper arm. The above-mentioned document therefore provides for an additional movable vacuum gripper to be provided as a separating device, which is designed to grip a substrate in the substrate magazine from above and thus lift or separate it from the substrate stack and deposit it on the conveyor belt alone or detached from the rest of the substrate stack.

BRIEF SUMMARY OF THE INVENTION

The invention is based on the object of creating an improved unloading device for a substrate magazine, which in particular has a smaller installation space requirement and a less complex actuator system that is usable for separation.

The object on which the invention is based is achieved by an unloading device having the features of claim 1. This has the advantage that a substrate stack is separated without a vacuum gripper, wherein the separation takes place in the unloading device and not in the substrate magazine itself, which means that no space has to be reserved in the substrate magazine itself, which would otherwise be necessary for a vacuum gripper to separate a substrate magazine.

According to the invention, it is provided for this purpose that the gripper arm is designed to push a substrate stack having multiple substrates lying one on top of another out of one of the drawers above the conveyor belt, that a separating device is arranged above the conveyor belt, into which the substrate stack is insertable by the gripper arm, and that the separating device is designed to detach the lowermost substrate of the substrate stack from the substrate stack and deposit it on the conveyor belt underneath. Because a substrate stack is separated downwards according to the invention, i.e., individual substrates are removed downwards from the substrate stack, a particularly compact solution is offered because a separated substrate can be deposited directly or nearly directly onto the conveyor belt. As a result, both the actuator system of the unloading device and the advantageous installation space are significantly smaller in comparison to previously known solutions.

The separating device preferably has two guide walls arranged spaced apart from one another, between which the substrate stack is receivable in a vertically guided manner. The guide walls ensure that the substrate stack is securely held between the guide walls and, in particular, remains in a shape. The guide walls prevent the substrates lying one on top of another from being pushed apart. Preferably, at least one of the guide walls is arranged to be horizontally displaceable in order to adapt the distance between the guide walls to a substrate stack to be received or received between the guide walls. The at least one guide wall is preferably assigned a controllable actuator, by means of which the guide wall can be displaced in an automated manner. In particular, it is provided that after the introduction of a substrate stack into the separating device, the at least one guide wall is moved towards the other guide wall in order to align the interposed substrate stack and, if necessary, push together any displaced substrates of the substrate stack.

Furthermore, it is preferably provided that the lower end of the guide walls is assigned two guide rails arranged spaced apart and parallel to one another, onto which a substrate stack can be pushed between the guide walls in such a way that the lowest substrate rests at two side edges facing away from one another on one of the guide rails in each case. For this purpose, the rails preferably protrude from the respective guide wall in the direction of the opposite guide wall, so that a substrate or substrate stack can be deposited at the edges on the guide rails between the guide walls. Since the substrates or the substrate stacks are only held at the edges, the area between the guide rails can be used for further actuators of the unloading device, in particular for the gripper arm.

Furthermore, it is preferably provided that a first of the guide walls ends at a distance from the first guide rail assigned thereto, which corresponds at least to the height of the lowest substrate, so that the lowest substrate is insertable laterally into a receptacle formed by the distance between the first guide wall and the first guide rail. In particular, the distance is less than the total height of two of the substrates lying one on top of another, so that the guide wall prevents two substrates from being able to be pushed into the receptacle at the same time. The distance is preferably adjustable so that the loading and unloading device is adaptable to different substrates or substrate stacks. For this purpose, for example, the guide wall is mounted so it is displaceable in height or vertically, wherein the guide wall is then preferably assigned a controllable actuator, in particular an electromotive, pneumatic, or hydraulic actuator, by means of which the guide wall is vertically displaceable. If the lowest substrate is now moved, it is ensured that only the lowest substrate is pushed into the receptacle. As a result, the lowest substrate is already separated from the remaining substrate stack.

The separating device preferably has an actuator device for moving the lowest substrate into the receptacle, wherein the depth of the receptacle corresponds to at least the width of the guide rail in front of the second guide wall, i.e., the opposite guide rail in front of the opposite guide wall. This ensures that the substrate is insertable into the receptacle far enough that it is no longer supported by the guide rail on the opposite side. As soon as the substrate has been inserted sufficiently far into the receptacle, it therefore falls down on the side of the second guide rail from this second guide rail in the direction of the conveyor belt. As a result, the substrate detaches from the substrate stack at least in some areas. If the height of the receptacle is sufficiently tall, this can result in the substrate also falling out of the receptacle as a whole independently onto the conveyor belt.

Furthermore, it is preferably provided that the actuator device is designed to insert the lowest substrate into the receptacle beyond the second guide rail. Preferably, the first actuator device is assigned to the second guide wall and guide rail and is designed as a sliding device. For this purpose, the actuator device preferably has a controllable actuator and an actuator element, which is preferably designed as a sliding plate which is mounted so it is horizontally displaceable in order to move a substrate in the direction of the receptacle. The sliding plate projects in particular through an opening which is formed between the second guide wall and the second guide rail.

Furthermore, it is preferably provided that the separating device has a second actuator device which is designed to move the lowest substrate out of the receptacle and beyond the first guide rail. The substrate, once inserted into the receptacle, can thus be pushed out of the receptacle again by the second actuator device. Because the substrate is already detached from the second guide rail at this moment and has fallen or tilted in the direction of the conveyor belt, pushing it back out of the receptacle ensures that the substrate is now completely detached from the separating device and thrown onto the conveyor belt underneath. The second actuator device also ensures that the distance between the first guide wall and the first guide rail only needs to be slightly greater than the height of the substrate to be received, since even if the substrate, which is already tilted on the opposite side in the direction of the conveyor belt, jams in the receptacle, the substrate is released from the clamping by the actuator device.

Preferably, the at least one conveyor belt is arranged under the guide rails at a vertical distance in particular that is greater than the height of the lowest substrate. This ensures that the lowest substrate, which is pushed back out of the receptacle, can be pushed completely under the first guide rail in order to be released from the second guide rail.

Furthermore, it is preferably provided that the separating device is designed such that the lowest substrate falls directly onto the at least one conveyor belt due to the displacement by means of the first and/or second actuator device. The device can thus be constructed particularly compactly with respect to height.

According to a further embodiment of the invention, two conveyor belts are preferably arranged parallel and spaced apart from one another, wherein one of the conveyor belts is assigned to each one of the guide rails. As a result, there is a conveyor belt for each of the guide rails onto which the respective substrate can fall from the respective guide rail. This ensures safe removal and secure receiving of the respective substrate.

Furthermore, it is preferably provided that, according to a further embodiment of the invention, at least one support rail is arranged on the carrier and is designed to be movable in height in order to lie between the guide rails in a receiving position above the transport level of the conveyor belt or belts and below the guide rails, so that the lowest substrate or the substrate pushed out of the receptacle falls onto the support rail, and to lie in a depositing position below the transport level, so that when the support rail is moved into the depositing position, the substrate is deposited on the transport level or the conveyor belt or the respective conveyor belt. By means of the support rail, the distance to the guide rails is reduced and thus the falling height of the separated substrate is reduced. This ensures, for example, that sensitive substrates cannot break or be damaged when they fall onto the conveyor belt. Rather, the support rail catches the substrate close to the support rail and only then deposits it on the lower transport level of the conveyor belt.

The carrier is preferably designed to be movable in height. As a result, the support rail and gripper arm are moved in height or vertically if necessary in order to enable safe transport and advantageous separation of a substrate stack. In particular, this ensures that a substrate stack is insertable completely into the separating device by means of the gripper arm and that the substrates can then be separated downwards due to sufficient free space below the substrate stack when the carrier is lowered.

According to a preferred refinement of the invention, the at least one support rail is assigned to the second guide rail, and is therefore close to the second guide rail in the unloading device or in the separating device. As a result, the first pushed-out end or the side of the isolated or lowest substrate, which falls down first from the second guide rail, is caught by the support rail and the falling height is advantageously reduced. When the substrate is then pushed out of the receptacle on the opposite side and over the first guide rail, the substrate is already supported by the support rail on the opposite side and thus the load the falling substrate experiences when it strikes the conveyor belt below the first guide rail is reduced in such a way that damage to the substrate is prevented. Optionally, an additional support rail is also assigned to the first guide rail in order to also reduce the falling height on the side of the first guide rail.

The substrate magazine system according to the invention having the features of claim 14 is characterized by the unloading device according to the invention. This results in the advantages already mentioned above. The substrate magazine system preferably has multiple substrate magazines that can be unloaded by the unloading device. For this purpose, the carrier of the unloading device is in particular also horizontally displaceable in order to be able to reach the multiple substrate magazines. Further advantages and preferred features and combinations of features result in particular from what has been described above and from the claims.

BRIEF DESCRIPTION OF THE DRAWINGS

The invention will be explained in more detail below with reference to the drawing. In the figures

DESCRIPTION OF EXAMPLE EMBODIMENTS

Figure 1:
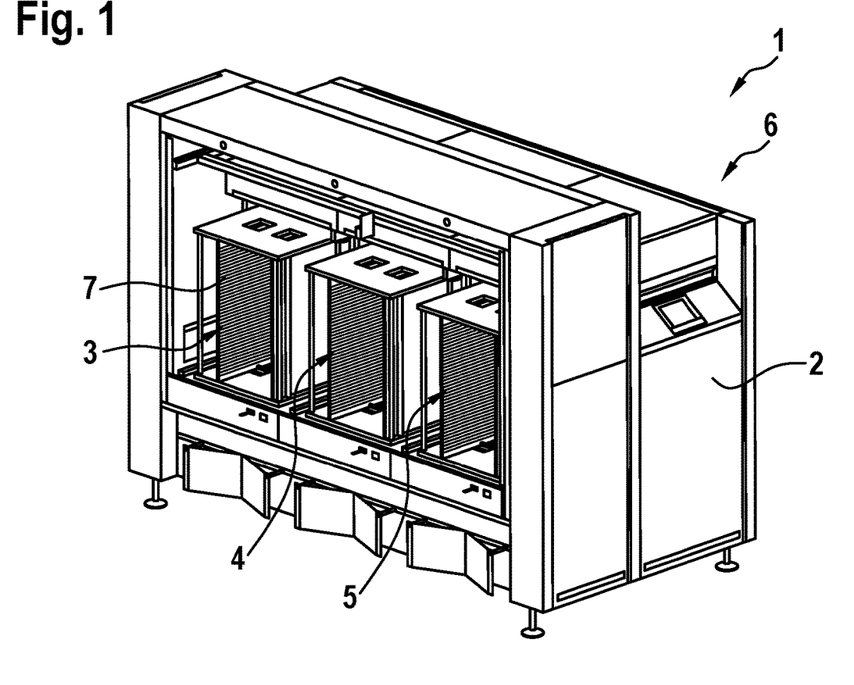
FIG. 1 shows a substrate magazine system in a perspective view.

FIG. 1 shows a substrate magazine system 1 in a simplified perspective view. The substrate magazine 1 is designed to be used in an assembly line in order to supply substrates, in particular printed circuit boards, solar cells, or wafers, to the assembly line, which are then printed and/or assembled on the assembly line, for example. For this purpose, the substrate magazine system 1 has a housing 2 in which multiple, in this case three, substrate magazines 3, 4, 5, as well as an unloading device 6, which is optionally also designed or usable for loading the substrate magazines, are arranged. The substrate magazines 3, 4, 5 are arranged adjacent to one another and each have a large number of drawers 7, which are arranged and aligned in parallel, one above another. A single, planar or flat substrate and/or a substrate stack is receivable in each drawer. A substrate stack is characterized by a large number of substrates lying directly one on top of another. Depending on the size of the drawers 7 and the substrates, only a single substrate or a substrate stack is receivable. Wherein, of course, a single substrate can also be arranged in the drawers in which a substrate stack is receivable.

The substrate magazine system 1 is used to store or temporarily store the substrates before they are automatically supplied to the assembly line. The substrate magazines 3, 4, 5 can be loaded manually or automatically, for example from the rear side shown in FIG. 1. For illustrative purposes, a rear wall is not shown in FIG. 1, so that the substrate magazines 3, 4, 5 can be seen. Optionally, there is a door in the rear wall or the rear wall as a whole is designed as a door to enable easy loading of the substrate magazines from the rear side.

Figure 2:
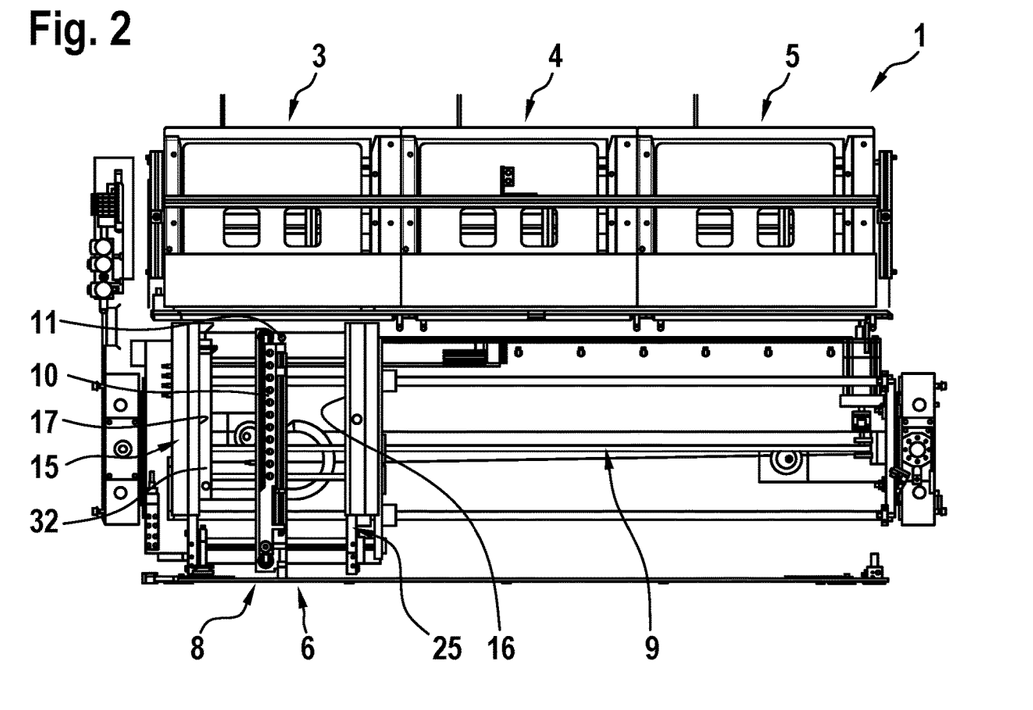
FIG. 2 shows the substrate magazine system in a top view.

FIG. 2 shows the substrate magazine system 1 in a simplified top view, wherein the housing 2 is not shown. The unloading device 6 arranged in the housing 2 has a carrier 8 which is mounted so that it is horizontally displaceable on a rail system 9 in order to be able to be pushed into position opposite to each of the substrate magazines 3, 4, 5

Figure 3:
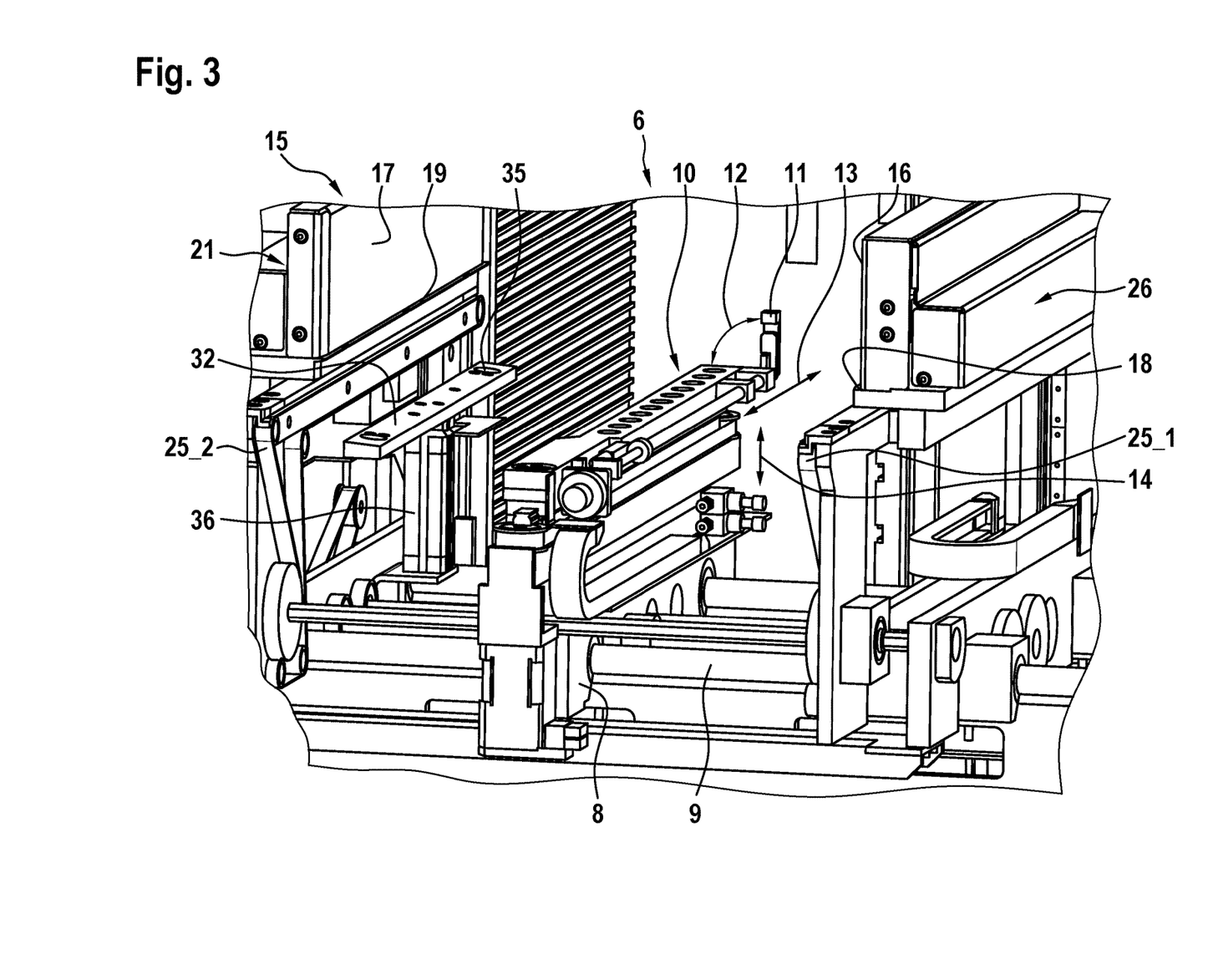
FIG. 3 shows an unloading device of the substrate magazine system in a perspective detailed view.

In FIG. 3, the unloading device 6 is shown in an enlarged perspective detailed view. The unloading device 6 has the above-mentioned carrier 8, which is mounted on the rail system 9 in a longitudinally displaceable manner. A gripper arm 10 is arranged on the carrier 8 and has a pivotable gripper finger 11 at one end. The gripper finger 11 is mounted pivotably around a horizontal axis, as shown by a double arrow 12. The gripper arm 10 is mounted so it is longitudinally displaceable transversely to the sliding direction of the carrier 8, as indicated by a further double arrow 13, in order to be able to be inserted into one of the substrate magazines 3, 4, 5, in front of which the carrier 8 is located at the moment. In addition, the carrier 8 or the gripper arm 10 is movable in height, as indicated by a double arrow 14. Preferably, the carrier 8 is additionally movable as a whole in height in order to be able to move the removal device 6 to a height at which a substrate or substrate stack is stored in the substrate magazine 3, 4, 5 in order to be able to push it out by means of the gripper arm 10.

To push out a substrate or substrate stack, the gripper arm 10 is first pushed under the substrate to be removed or under the substrate stack to be removed with the gripper finger 11 pivoted into the horizontal orientation. As soon as the gripper arm 10 is pushed completely under the substrate or the lowest substrate of the substrate stack, the gripper finger 11 is pivoted into the vertical orientation shown in FIG. 1 and the gripper arm 10 is pulled back out of the substrate magazine 3, 4, 5. The substrate or substrate stack is also pulled or pushed out of the substrate magazine 3, 4, 5 by the gripper finger 11.

The unloading device 6 also has a separating device 15, which is used to separate a substrate stack pushed out of the substrate magazine 3, 4, or 5 by the gripper arm 10, so that individual substrates of the substrate stack are supplied to the assembly line.

For this purpose, the separating device 15 has two guide walls 16 and 17, which are arranged spaced apart from one another and aligned parallel to one another in order to be able to receive a substrate stack between them. At least one of the guide walls 16 and/or 17 is mounted so that it is horizontally displaceable in order to be able to adapt the distance to the substrate stack to be received. The substrate stack is securely held and aligned between the guide walls 16, 17 by the guide walls 16, 17.

The separating device 15 also has a first guide rail 18 and a second guide rail 19, which are aligned parallel to one another and arranged spaced apart from one another. The first guide rail 18 is arranged below the guide wall 16 and the second guide rail 19 below the guide wall 17. The guide rails 18, 19 are each assigned to the lower end of the respective guide wall 16, 17, wherein the guide walls 16, 17 end spaced apart from the guide rails 18, 19. The guide rails 18, 19 each protrude from the guide wall 16, 17 in the direction of the opposite guide wall 17, 16 and are thus used as a support for a substrate or for the lowest substrate of the substrate stack. This substrate is pushed by the gripper arm 10 out of the substrate magazine 3, 4, or 5 onto the guide rails 18, 19 between the guide walls 16, 17, wherein the lowest substrate of the substrate stack then only rests and is guided at the edges on the guide rails 18, 19.

Figure 4:
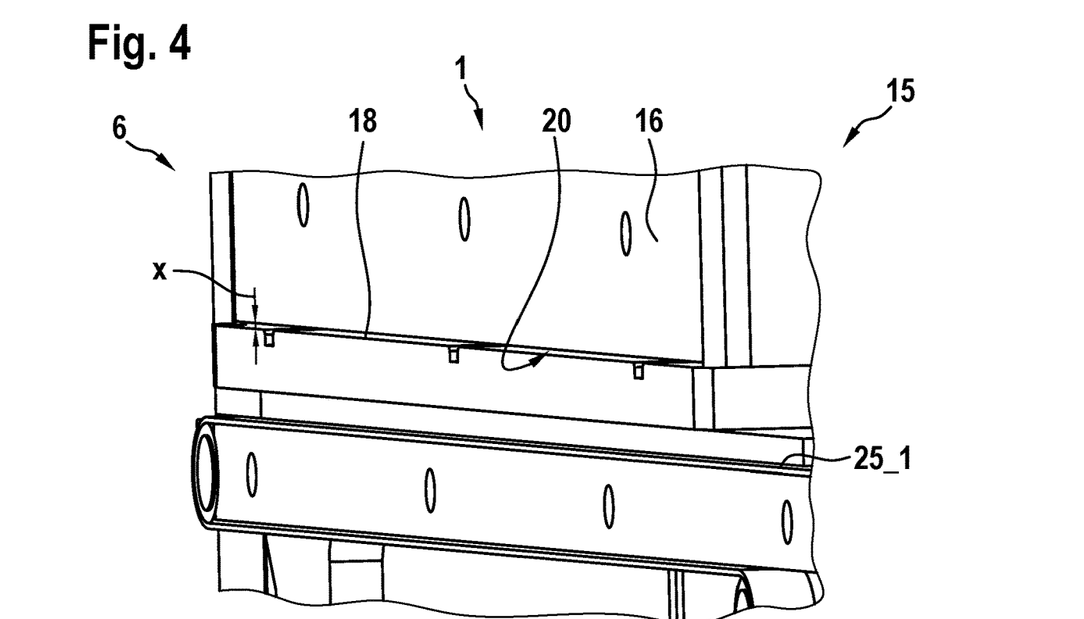
FIG. 4 shows a first part of the unloading device in a perspective detailed view.

FIG. 4 shows a perspective detailed view of the separating device 15 with a view of the first guide wall 16. As shown in FIG. 4, the guide wall 16 ends at a distance x from the guide rail 18, so that a receptacle 20 is formed between the guide rail 18 and the guide wall 16, which will be discussed in more detail below.

Figure 5:
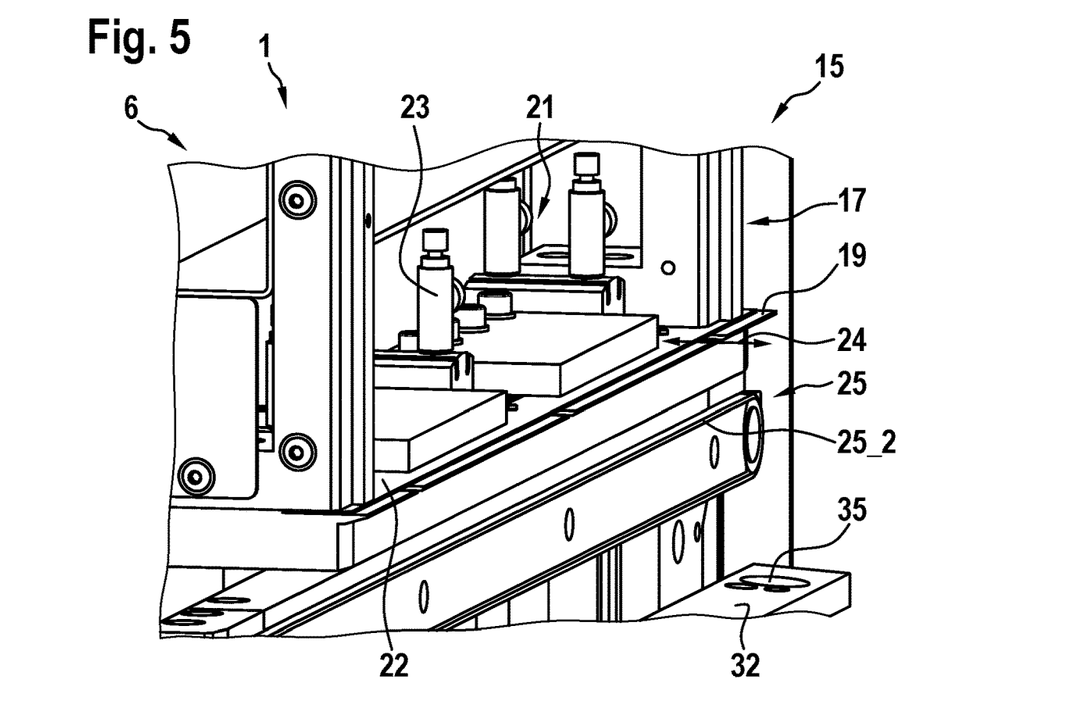
FIG. 5 shows a second part of the unloading device in a perspective detailed view.

FIG. 5 shows the separating device 15 with a view of the second guide wall 17, wherein the second guide wall 17 is not shown at this point in order to show the components of the separating device 15 behind it. The guide wall 17 also ends at a distance from the guide rail 19 assigned thereto, wherein the distance can correspond to the distance x or can be selected differently. Preferably, the distance from the guide wall 17 to the guide rail 19 is less than the height of the individual substrates of the substrate stack to be received or received.

A first actuator device 21 is arranged behind the guide wall 17. The actuator device 21 has an actuator element 22 in the form of a sliding plate which rests on the guide rail 19 and extends in its longitudinal extension. Furthermore, the actuator device 21 has a controllable actuator 23, which is designed, for example, as an electromechanical, hydraulic, or pneumatic actuator, in order to displace the actuator element 22 vertically, as shown by a double arrow 24. The actuator element 22 is displaceable horizontally in such a way that it is displaceable in the direction of the opposite guide wall 16 and back. The actuator element 22 is displaceable to such an extent that it is displaceable beyond the edge or the end of the guide rail 19 in the direction of the opposite guide wall 16.

The actuator element 22 is used to insert the lowest substrate of the substrate stack, which rests at the edges on the guide rail 19, in the direction of the opposite guide wall 16 or into the receptacle 20 formed underneath until the lowest substrate is pushed out over the edge or the free end of the guide rail 19, so that from there it optionally falls directly down onto a conveyor belt 25 underneath.

According to this exemplary embodiment, the conveyor belt is formed in several parts and has a first conveyor belt 25_1 and a second conveyor belt 25_2. The first conveyor belt 25_1 is arranged below the first guide rail 18, as shown in FIG. 4, and the second conveyor belt 25_2 is arranged below the guide rail 19, as shown in FIG. 5. The second conveyor belt 25_2 is arranged and/or designed in such a way that the lowest substrate can fall from the guide rail 19 directly onto the conveyor belt 25_2.

The slide plate or the actuator element 22 has a height that is smaller than the distance of the guide wall 17 from the guide rail 19, so that the actuator element 22 is displaceable through the slot or the opening between the guide wall 17 and the guide rail 19 onto the section of the guide rail 19 protruding from the guide wall 17.

Because the lowest substrate of the substrate stack is pushed by the actuator element 22 in the direction of the opposite guide wall 16, and because the lowest substrate rests on the guide rail 18, the lowest substrate is inserted into the receptacle 20 between the guide wall 16 and the guide rail 18 by the actuator device 21. Distance x is therefore to be selected to be greater than the height of the substrate or, in the case of a preferably displaceable guide wall 16, adjusted. In this case, distance x is also preferably less than twice the height of the substrate, so that the substrate above it is not displaced when the lowest substrate is displaced and is rather prevented from being displaced by the guide wall 16. This means that only the lowest substrate is displaced and detached or separated from the remaining substrate stack.

Figure 6:
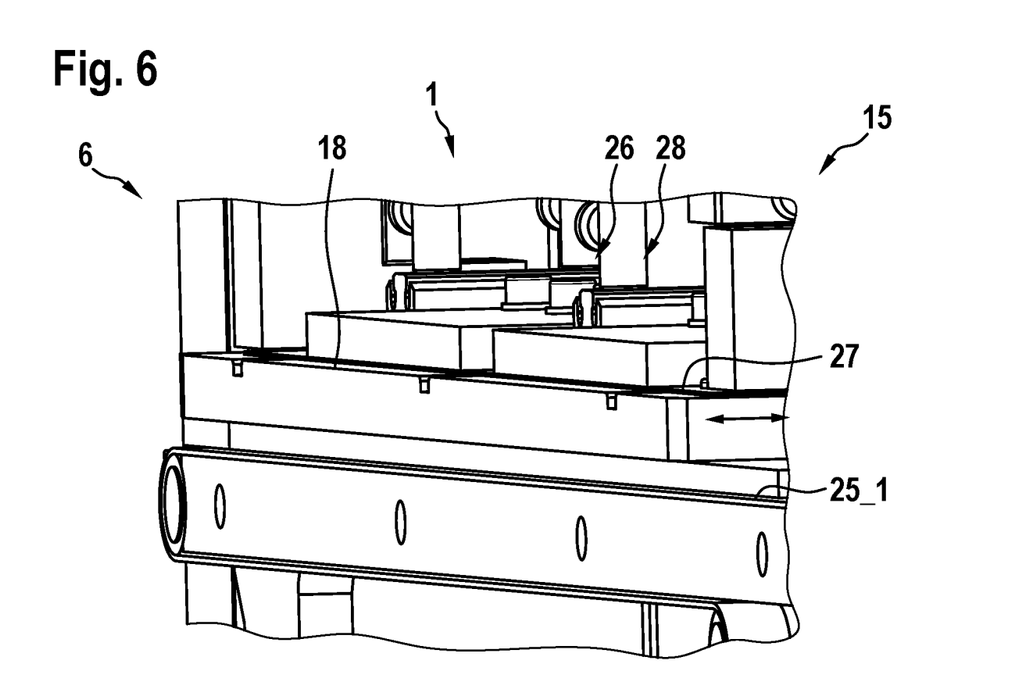
FIG. 6 shows the first part of the unloading device in another perspective detailed view.

FIG. 6 shows a perspective detailed view of the separating device 15 as shown in FIG. 4, but without the guide wall 16. Also on this side of the separating device 15, an actuator device 26 is arranged behind the guide wall 16, which has a displaceable actuator element 27 and a controllable actuator 28, which is designed in particular like the actuator 23. The actuator element 27 corresponds to the actuator element 22 and is preferably designed as a sliding plate which rests on the guide rail 18 and is displaceable back and forth or horizontally by the actuator 28. The respective sliding plate is designed, for example, as a sheet metal element. In its starting position, the actuator element 27 lies in particular in such a way that it is set back from the guide wall 16 and thus releases the receptacle 20. If it is advanced by the actuator 28, it is advanced far enough that it is displaced beyond the outer edge of the guide rail 18 in the direction of the opposite guide wall 17. If the lowest substrate has previously been inserted into the receptacle 20, it is now pushed out of the receptacle 20 again by the guide element 27 and pushed out over the projection formed by the guide rail 18, so that the substrate also falls down from the guide rail 18 on this side in the direction of the conveyor belt 25 or 25_1. The lowest substrate then lies completely on the conveyor belt 25 and can thus be transported further in order to be supplied to the assembly line. Now the process is repeated and the substrate that is now at the bottom, which now forms the bottom substrate of the substrate stack, is separated as described above.

Figure 7:
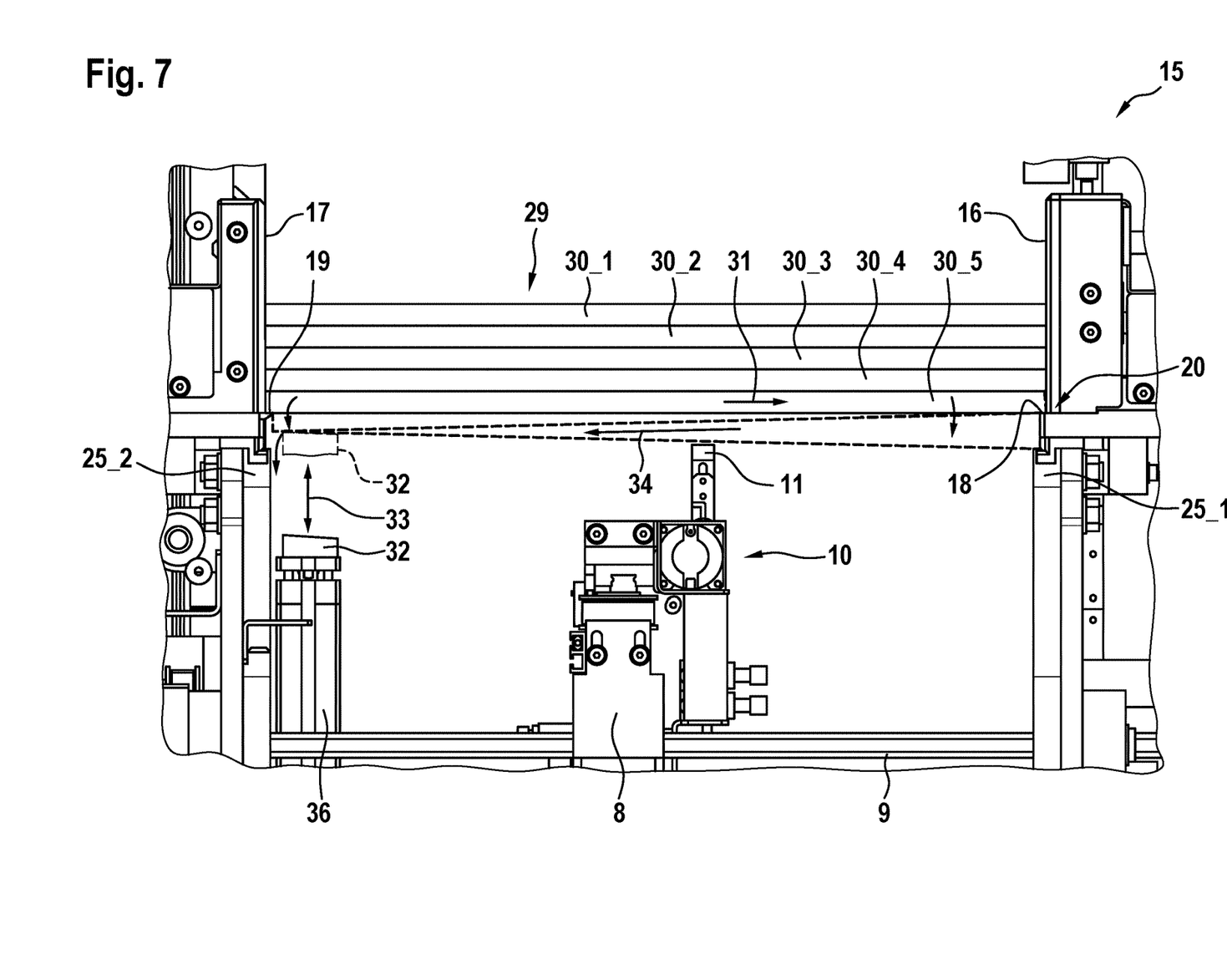
FIG. 7 shows a side view of the unloading device.

In FIG. 7, this process is shown in simplified form using a substrate stack 29, which was pushed into the separating device 15 by the gripper arm 11.

According to the present exemplary embodiment, the substrate stack 29 has five substrates 30_1, 30_2, 30_3, 30_4, and 30_5. The lowest substrate 30_5 rests at the edges on the guide rails 18, 19. Furthermore, the underside of the lowest substrate 30_5 is exposed. The substrates 30_1 to 30_5 are laterally aligned and held by the guide walls 16 and 17. After the substrate stack 29 has been introduced into the separating device 15, the gripper arm 10 is moved back down to its starting position, so that a distance remains between the gripper arm 10 and the substrate stack 29. In particular, the gripper arm 10 is moved so far down that it lies below the transport level of the conveyor belt 25.

Subsequently, the lowest substrate 30_5 is pushed into the receptacle 20 by the first actuator device 21, as shown by an arrow 31. As soon as the substrate 30_5 has been pushed out of the guide rail 19, the substrate 30_5 falls down on the left side in the image in the direction of the conveyor belt 25_2.

In order to reduce the falling height, a support rail 32 is preferably present, the height of which is adjustable in particular by a pneumatic, hydraulic, or electromechanical cylinder 36. In particular, the support rail 32 is moved upwards, as shown by an arrow 33, in particular before the first substrate 30_5 is pushed into the receptacle 20. In this receiving position, the support rail 32 lies at a height between the transport level of the conveyor belt 25 and the guide rail 19. The substrate 30_5 thus initially falls onto the support rail 32 on the left and is held thereby, as indicated in FIG. 7 by a dashed line of the substrate 30_5. Subsequently, the substrate 30_5 is pushed back in the opposite direction by the second actuator device, as indicated by an arrow 34, so that the substrate 30_5 also falls down on a right side from the guide rail 18. In this case, the substrate 30_5 falls directly onto the conveyor belt 25_1. The substrate 30_5 now again rests tilted on one side on the support rail 32 and on the other side on the conveyor belt 25_1. The support rail 32 is then moved downwards into its starting position, in which it lies below the transport level. As a result, the support rail 32 deposits the substrate 30_5 on the conveyor belt 25_2, and the substrate 30_5 is completely detached from the substrate stack 29 and can be transported further by the conveyor belt 25 for further use.

Preferably, for example, the guide rail 19 is assigned a sensor which detects without contact, in particular optically, whether a substrate stack 29 is located in the separating device 15 at the desired location. For example, the sensor 35 is arranged on the support rail 23 or the gripper arm 10, as shown by way of example in FIG. 3.

The advantageous unloading device 6 ensures that substrate stacks can be separated advantageously in a small installation space. At the same time, the unloading device can also be used to remove individual substrates from the respective magazine 3, 4, 5. The unloading device is therefore usable in a variety of ways.

The invention claimed is:

1. An unloading device for a substrate magazine, wherein the substrate magazine has multiple drawer in which substrates are arrangeable for storage or temporary storage, having at least one controllable conveyor belt on which substrates can be placed, and having at least one controllable gripper arm, which is designed to push at least one substrate out of a drawer of the substrate magazine to the conveyor belt, wherein the conveyor belt and the gripper arm are arranged on a common and movably mounted carrier, wherein the gripper arm is arranged, at least in a starting position, below the conveyor belt in order to grip at least one substrate from below for pushing out, wherein the gripper arm is designed to push a substrate stack having multiple substrates lying one on top of another out of one of the drawers above the conveyor belt, in that a separating device is arranged above the conveyor belt, into which the substrate stack is insertable by the gripper arm, and in that the separating device is designed to release the lowest substrate of the substrate stack from the substrate stack and deposit it on the underlying conveyor belt.

2. The unloading device according to claim 1, wherein the separating device has two guide walls arranged spaced apart from one another, between which the substrate stack is receivable in a vertically guided manner.

3. The unloading device according to claim 1, wherein the lower end of the guide walls is assigned two guide rails arranged spaced apart and parallel to one another, on which a substrate stack can be pushed between the guide walls so that the lowest substrate of the substrate stack rests on two side edges facing away from one another on one of the guide rails in each case.

4. The unloading device according to claim 1, wherein a first of the guide walls ends at a distance (x) from the first guide rail assigned thereto, which corresponds at least to the height of the lowest substrate, so that the lowest substrate is insertable into a receptacle formed by the distance (x) between the first guide wall and the first guide rail.

5. The unloading device according to claim 1, wherein the depth of the receptacle corresponds at least to the width of the second guide rail in front of the second guide wall.

6. The unloading device according to claim 1, wherein the separating device has a first actuator device which is designed to insert the lowest substrate into the receptacle and over the (second) guide rail.

7. The unloading device according to claim 1, wherein the separating device has a second actuator device which is designed to push the lowest substrate out of the receptacle and over the first guide rail.

8. The unloading device according to claim 1, wherein the at least one conveyor belt is arranged under the guide rails at a distance which is greater than the height of the lowest substrate.

9. The unloading device according to claim 1, wherein the separating device is designed such that the lowest substrate falls directly onto the at least one conveyor belt due to the displacement by means of the first and/or second actuator device.

10. The unloading device according to claim 1, wherein two conveyor belts are arranged in parallel and spaced apart from one another, wherein one of the conveyor belts is assigned to each one of the guide rails.

11. The unloading device according to claim 1, wherein at least one support rail is arranged on the carrier and is movable in height in order to lie between the guide rails in a receiving position above the transport level of the respective conveyor belt and below the guide rails, so that the lowest substrate falls onto the support rail, and in a depositing position below the transport level.

12. The unloading device according to claim 1, wherein the carrier is designed to be movable in height.

13. The unloading device according to claim 1, wherein the at least one support rail is assigned to the second guide rail.

14. A substrate magazine system for a processing line, of planar substrates, having at least one substrate magazine which has multiple drawers in which multiple substrates and/or substrate stacks are arrangeable for storage or intermediate storage, wherein an unloading device according to claim 1.

* * * * *